United States Patent
Chen et al.

[11] Patent Number: 5,912,845
[45] Date of Patent: Jun. 15, 1999

[54] METHOD AND CIRCUIT FOR SUBSTRATE CURRENT INDUCED HOT E⁻ INJECTION (SCIHE) APPROACH FOR $V_T$ CONVERGENCE AT LOW $V_{CC}$ VOLTAGE

[75] Inventors: Chia-Shing Chen; Mam-Tsung Wang, both of Hsin Chu; Wenpin Lu, E-Lan; Ming-Hung Chou, Miao-Li; Ying-Che Lo, Tainan; Ming-Shang Chen, Hsing Chu, all of Taiwan

[73] Assignee: Macronix International Co., Ltd., Taipei, Taiwan

[21] Appl. No.: 08/926,554

[22] Filed: Sep. 10, 1997

[51] Int. Cl.⁶ .................................................. G11C 16/04
[52] U.S. Cl. ................................. 365/185.3; 365/185.18; 365/185.21
[58] Field of Search ............................. 365/185.3, 185.18, 365/185.21, 185.01, 185.28

[56] References Cited

U.S. PATENT DOCUMENTS

| | | | |
|---|---|---|---|
| 4,875,188 | 10/1989 | Jungroth | 365/185 |
| 5,042,009 | 8/1991 | Kazerounian et al. | 365/189.01 |
| 5,233,562 | 8/1993 | Ong et al. | 365/218 |
| 5,258,949 | 11/1993 | Chang et al. | 365/185.3 |
| 5,349,220 | 9/1994 | Hong | 365/218 |
| 5,399,891 | 3/1995 | Yiu et al. | 257/316 |
| 5,406,521 | 4/1995 | Hara | 365/185.3 |
| 5,414,664 | 5/1995 | Lin et al. | 365/218 |
| 5,416,738 | 5/1995 | Shrivastava | 365/185 |
| 5,467,306 | 11/1995 | Kaya et al. | 365/185.2 |
| 5,487,033 | 1/1996 | Keeney et al. | 365/185.19 |
| 5,508,959 | 4/1996 | Lee et al. | 365/185.3 |
| 5,546,340 | 8/1996 | Hu et al. | 365/185.3 |
| 5,554,868 | 9/1996 | Hayashikoshi et al. | 257/215 |
| 5,561,620 | 10/1996 | Chen et al. | 365/185.3 |
| 5,596,530 | 1/1997 | Lin et al. | 365/185.3 |
| 5,615,153 | 3/1997 | Yiu et al. | 365/185.3 |
| 5,642,311 | 6/1997 | Cleveland et al. | 365/185.3 |
| 5,657,271 | 8/1997 | Mori | 365/185.27 |
| 5,745,410 | 4/1998 | Yiu et al. | 365/185.3 |

OTHER PUBLICATIONS

Hu, C. et al., "Substrate–Current–Induced Hot Electron (SCIHE) injection: a new convergence scheme for flash memory", IEDM 95, IEEE (1995), pp. 283–286.

*Primary Examiner*—David Nelms
*Assistant Examiner*—Tuan T. Nguyen
*Attorney, Agent, or Firm*—Haynes & Beffel LLP

[57] ABSTRACT

A method for soft programming memory cells and floating gate memory device. During soft programming, a gate voltage is supplied to the control gate, a drain voltage it supplied to the drain, a well voltage is supplied to the well, and an active current limiter is coupled to the source. A circuit for soft programming supplies a gate voltage to the control gate, couples a constant current source to the drain, supplies a well voltage to the well, and supplies a source voltage to the source. The gate voltage may be approximately 2 V, the drain voltage may be approximately 4 V, and the well voltage may be approximately −2 V. According to another embodiment of the invention, the gate voltage is approximately 2 V lower than the drain voltage, and the well voltage is approximately 4 V lower than the gate voltage.

13 Claims, 6 Drawing Sheets

METHOD AND CIRCUIT FOR SUBSTRATE CURRENT INDUCED HOT E⁻ INJECTION (SCIHE) APPROACH FOR $V_T$ CONVERGENCE AT LOW $V_{CC}$ VOLTAGE

BACKGROUND OF THE INVENTION

1. Field of the Invention

This invention relates to floating gate memory devices, such as flash memory, and in particular to methods and circuits for repairing over-erased floating gate memory cells.

2. Description of Related Art

Non-volatile memory design based on integrated circuit technology represents an expanding field. Several popular classes of non-volatile memory are based on arrays of floating gate memory transistors which are electrically erasable and programmable.

The act of programming a memory array of floating gate memory transistors in one popular approach involves injecting the floating gate of addressed cells with electrons which causes a negative charge to accumulate in the floating gate and the turn-on threshold of the memory cell to increase. Thus, when programmed, the cells will not turn on, that is, they will remain non-conductive when addressed with read potentials applied to the control gates. The act of erasing a cell having a negatively charged floating gate involves removing electrons from the floating gate to lower the threshold. With the lower threshold, the cell will turn on to a conductive state when addressed with a read potential to the control gate. For an opposite polarity array, programming involves selectively removing electrons from the addressed cells' floating gates.

Floating gate memory cells suffer the problem of over-erasure, particularly when erasing involves lowering the threshold by removing electrons from the floating gate. During the erase step, over-erasure occurs if too many electrons are removed from the floating gate leaving a slight positive charge. The positive charge biases the memory cell slightly on, so that a small current may leak through the memory even when it is not addressed. A number of over-erased cells along a given data line can cause an accumulation of leakage current sufficient to cause a false reading.

In addition to causing false readings, when floating gate cells are over-erased, it makes it difficult to successfully reprogram the cells using hot electron programming, particularly with embedded algorithms in the integrated circuits. This difficulty arises because the program current will be large and, due to series resistance, the effective $V_{DS}$ across cell will drop so that the e⁻ injection efficiency will decrease.

Further, because the erase and program operations can affect different cells in a single array differently, floating gate memory designs often include circuitry for verifying the success of the erasing and programming steps. See, for instance, U.S. Pat. No. 4,875,188, entitled VOLTAGE MARGINING CIRCUIT FOR FLASH MEMORY, invented by Jungroth. If the array does not pass erase verify, the entire array is usually re-erased. The re-erase process can aggravate over-erased cells in the array.

One solution to the over-erase problem associated with the erase verification process is disclosed in U.S. Pat. No. 5,414,664, FLASH MEMORY WITH BLOCK ERASE FLAGS FOR OVER-ERASURE PROTECTION, issued to Lin et al. on May 9, 1995, which shows a method and a device where only those blocks which fail the erase verify operation are re-erased. Accordingly, a re-erase of the entire array after each verify operation is not required. This mitigates the over-erase phenomenon, but does not solve it entirely.

Thus, a repair process has been developed to correct over-erased cells. U.S. Pat. No. 5,233,562, entitled METHODS OF REPAIRING FIELD-EFFECT CELLS IN AN ELECTRICALLY ERASABLE AND ELECTRICALLY PROGRAMMABLE MEMORY DEVICE, issued to Ong, et al., describes processes for such repair using so called drain disturb, source disturb or gate disturb techniques. After each repair in the Ong patent, a time consuming repair verification operation of the entire array is provided. See, also, U.S. Pat. No. 5,416,738 to Shrivastava for further background information.

Another attempt to solve the over-erase problem is described in U.S. Pat. No. 5,546,340, entitled NON-VOLATILE MEMORY ARRAY WITH OVER-ERASE CORRECTION, issued to Hu et. al. Hu describes a negatively biased substrate. Hu describes bulk correction of over-erased devices within in array. Hu describes bulk correction of an array of over-erased devices as carried forth in a convergence technique which utilizes higher floating gate injection currents.

A low current method of programming flash EEPROMS is described in U.S. Pat. No. 5,487,033, entitled STRUCTURE AND METHOD FOR LOW CURRENT PROGRAMMING OF FLASH EEPROMS, issued to Keeney et. al. Keeney indicates that a control gate voltage may be stepped or ramped from a minimum value to a maximum value to further reduce the peak channel current and to allow the flash cell threshold voltage to be placed to an exact value, for MLC applications.

For further discussion of a technique for correction of over-erasure of flash EPROMS, please refer to U.S. Pat. No. 5,467,306, entitled METHOD OF USING SOURCE BIAS TO INCREASE THRESHOLD VOLTAGES AND/OR TO CORRECT FOR OVER-ERASURE OF FLASH EPROMS, issued to Kaya, et. al.

In any case, the repair and repair verification processes are time-consuming. Therefore, a method and device which repairs over-erased cells in FLASH memory, and other floating gate memory, more quickly and efficiently is needed.

SUMMARY OF THE INVENTION

The present invention includes a method for soft programming memory cells and a floating gate memory device. During soft programming, a gate voltage is supplied to the control gate, a drain voltage it supplied to the drain, a well voltage is supplied to the well, and an active current limiter is coupled to the source.

An embodiment of the invention includes a circuit for soft programming that supplies a gate voltage to the control gate of a floating gate, couples a constant current source to the drain, supplies a well voltage to the well, and supplies a source voltage to the source.

According to one embodiment of the invention, the gate voltage is approximately 2 V, the drain voltage is approximately 4 V, and the well voltage is approximately −2 V. According to another embodiment of the invention, the gate voltage is approximately 2 V lower than the drain voltage, and the well voltage is approximately 4 V lower than the gate voltage.

An embodiment of the invention includes a method for correcting an over-erase condition within a non-volatile memory array. A method includes providing a non-volatile memory array having a plurality of single transistor memory cells, each memory cell comprising a stacked pair of control and floating gates spaced above a channel region interposed between a source and drain region. A non-negative voltage is applied to the control gate, an active current limiter to the source region, a negative voltage to the channel region, and a positive voltage to the drain region.

DETAILED DESCRIPTION

A detailed description of preferred embodiments of this invention is provided with reference to the figures. The soft program of this invention may be part of an embedded erase sequence of a floating gate memory cell device, such a device including an array of cells arranged in blocks. The soft program generates pulses for quickly repairing over-erased cells block by block, while limiting the amount of current generated during the process.

During soft programming, a gate voltage is supplied to the control gate, a drain voltage it supplied to the drain, a well voltage is supplied to the well, and an active current limiter is coupled to the source. Embodiments of the invention have the advantage that usable electrons flowing from the current source are conducted to cells having lower $V_T$, where cell conductance is much higher, increasing soft program efficiency.

The use of the active current limiter coupled to the source has advantages over approaches that use a ground or a constant voltage source coupled to the source or approaches that use a diode connection. The active current limiter also has advantages over approaches where a source bias is established by a diode connection, a series resistance, or feedback circuitry monitoring the flash cell's drain and gate. Unlike various prior approaches, using the active current limiter has an advantage of helping to keep electron flow constant.

Figure 1:
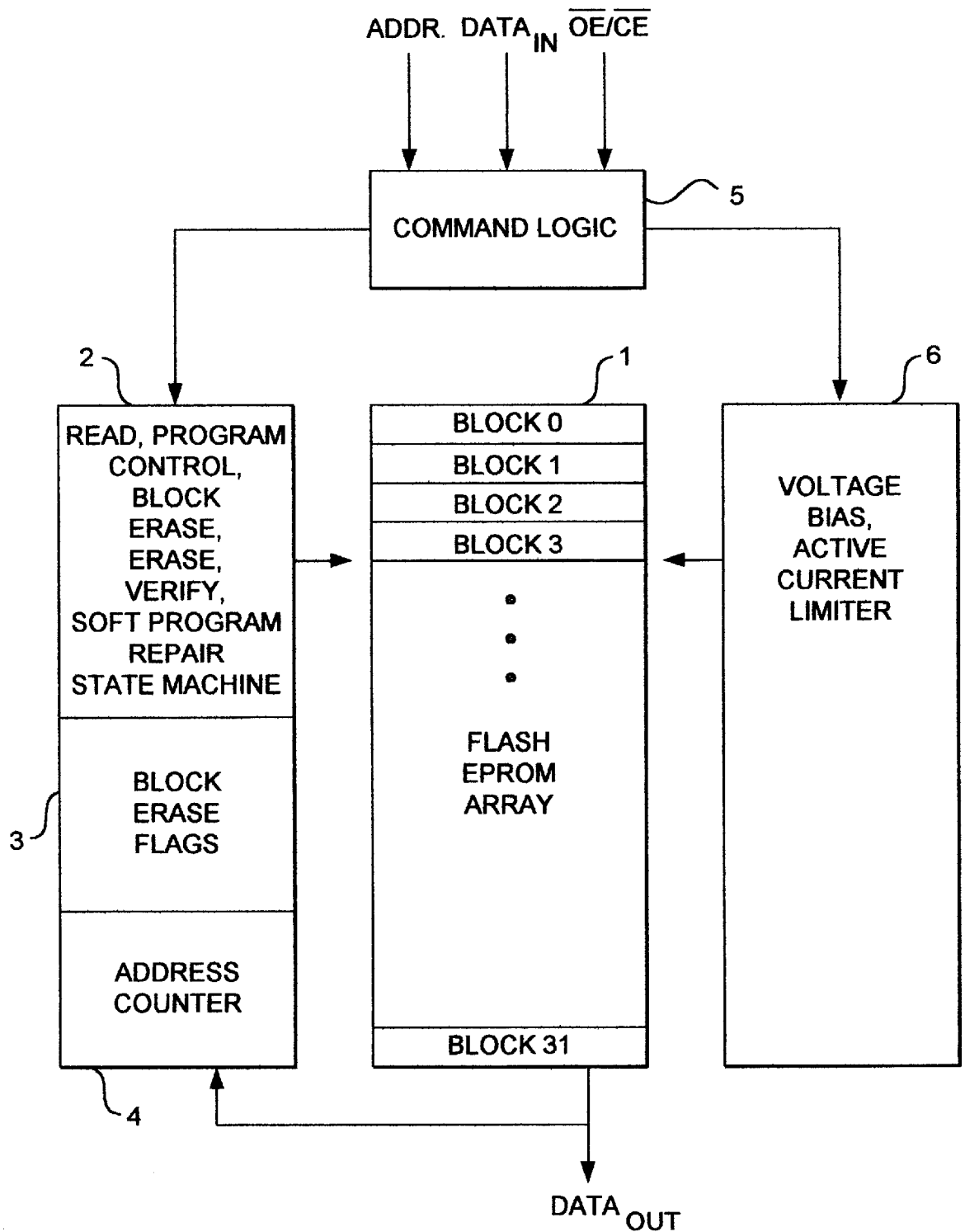
FIG. 1 is a schematic block diagram providing an overview of an integrated circuit according to an embodiment of the present invention.

FIG. 1 shows the basic structure of a 4 megabyte floating gate memory cell integrated circuit incorporating an embodiment of the invention. The circuit includes a memory array, generally 1, which is divided into a plurality of blocks (32 blocks in the figure). The segmentable architecture of the memory array allows application of the repair pulse of this invention to cell blocks individually, thus allowing block by block repair of over-erased cells. The array architecture is described in detail below with reference to FIG. 2.

Still referring to FIG. 1, coupled with the array 1 are a voltage bias/active current limiter, generally 6, and a read/program control/block erase/erase verify/repair circuit, generally 2. Voltage bias/active current limiter, generally 6, provide enhanced efficiency during soft programming. The read/program control/block erase/erase verify/repair circuit 2 is coupled to block erase flags 3. An address counter 4 is included for incrementing through memory cells, blocks or the entire array for the erase/erase verify/repair sequence.

The chip includes command logic 5 which is coupled to the address, data, and other control lines such as the output enable and chip enable signals. The command logic 5 interprets inputs to set a mode of operation for the voltage bias/active current limiter 6 and the read/program control/block erase/erase verify/repair circuit 2.

Command logic 5 may be implemented as done in standard floating gate memory integrated circuits, such as Am28F020 flash memory chip manufactured by Advanced Micro Devices, Inc. of Sunnyvale, Calif. with additional commands of this invention for cell, block, or array erase. In response to commands issued by the command logic 5, an embedded erase operation is executed by state machines in the read/program control/block erase/erase verify/repair circuit 2. The user, through a host CPU or otherwise, supplies address and data signals to the command logic 5 to indicate a preferred mode of operation. The modes executed by read/program control/block erase/erase verify/repair circuit 2 include a chip erase mode in which all blocks in the array 1 are to be erased and a block erase mode in which selected blocks in the array 1 are to be erased. In response to user input, blocks to be erased are identified by block or sector erase flags 3 stored on the chip.

Figure 2A:
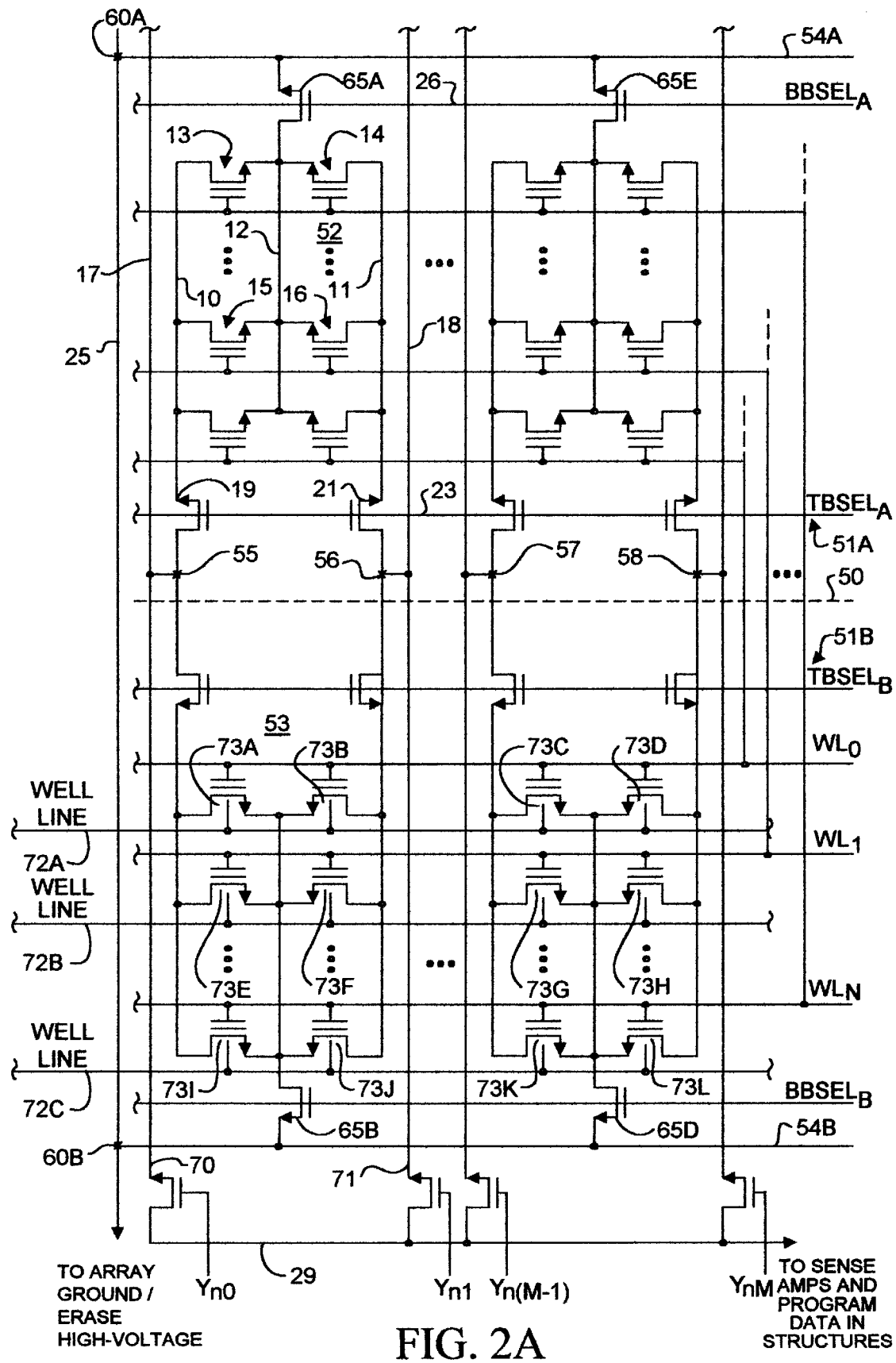
FIG. 2A is a circuit diagram showing a segmented array architecture for a floating gate memory cell device.

FIG. 2A illustrates the details of a segmentable array architecture in a drain-source-drain configuration of the floating gate memory circuit in which this invention may be implemented, and like that described U.S. Pat. No. 5,399,891, entitled NON-VOLATILE MEMORY CELL AND ARRAY ARCHITECTURE, issued Mar. 21, 1995 which is incorporated by reference herein. Other array architectures may be used, as well.

The circuit includes a first local bit line 10 and a second local bit line 11 which are implemented by buried diffusion conductors. Also, included is a common source connection line 12 implemented by buried diffusion. A plurality of floating gate transistors have drains and sources coupled to the local bit lines 10, 11, and common source connection line 12. Any number of these floating gate transistors in a single block may suffer from over-erasure as a result of the erase step mentioned above, and in varying degrees.

The drains of the first column of transistors, generally 13, are coupled to the first local bit line 10, and the drains of the second column of transistors, generally 14, are coupled to the second local bit line 11. The gates of the floating gate transistors are coupled to word lines $WL_0$ through $WL_N$, where each word line (e.g., $WL_1$) is coupled to the gate of a transistor (e.g., transistor 15) in the first local bit line 10 and a transistor (e.g., transistor 16) in the second local bit line 11. The transistors 15 and 16 can be considered a two transistor cell with a shared source diffusion.

The act of charging the floating gate is called the program step for the floating gate memory cell. This is accomplished on a byte by byte basis through hot electron injection by establishing a large positive voltage between the gate and the source, such as twelve volts, and a positive voltage between the drain and the source, such as six volts.

The act of discharging the floating gate is called the erase step for the floating gate memory cell. This is accomplished through the F-N (Fowler-Nordheim) tunneling mechanism between the floating gate and the source (source erase) or between the floating gate and the substrate (channel erase). The source erasing is performed by applying a positive bias to the source, such as twelve volts or seven volts, while the gate is grounded or negatively biased, such as minus seven volts. The channel erasing on a block basis is performed by applying a negative bias to the gate and/or a positive bias to the substrate.

Individual blocks of cells are controlled by select signals, that is, top block select signals TBSEL$_A$ and TBSEL$_B$ and bottom block select signals BBSEL$_A$ and BBSEL$_B$. The individual control of the blocks provides the ability to apply a repair pulse to selected local bit lines 10 and 11.

Still referring to FIG. 2A, a first global bit line 17 and a second global bit line 18 are associated with each drain-source-drain block. The first global bit line 17 is coupled to the source of top block select transistor 19 through a metal-to-diffusion contact 55. Similarly, the second global bit line 18 is coupled to the source of top block select transistor 21 through a metal-to-diffusion contact 56. The drains of the top block select transistors 19, 21 are coupled to the first and second local bit lines 10 and 11, respectively. The gates of the top block selector transistors 19, 21 are thus controlled by a top block select signal TBSEL$_A$ on line 23.

In a similar manner, the gate of the transistor 65A is controlled by a bottom block select signal BBSEL$_A$ across line 26. The local common source connection line 12 is coupled to a terminal across conductor 54A through transistor 65A. The drain of the transistor 65A is coupled to the common source connection line 12. The source of the transistor 65A is coupled to the conductor 54A. In this architecture, the conductor 54A is a buried diffusion conductor which extends to a metal-to-diffusion contact 60A at a position displaced horizontally through the array, which provides contact to a vertical metal bus 25.

For sense amps and program data in structures, a data line 29 is coupled to the global bit lines 17 and 18 which extend vertically through the array to respective column select transistors 70, 71. Thus, the source of column select transistor 70 is coupled to global bit line 17, the gate of column select transistor 70 is coupled to a column decode signal Y$_{n0}$, and the drain of the column select transistor 70 is coupled to data line conductor 29.

The blocks of floating gate memory cells as shown in FIG. 1 are configured into a plurality of subarrays as illustrated in FIG. 2A which illustrates two subarrays within a larger integrated circuit. The subarrays are divided generally along dotted line 50 and include subarray 51 A generally above the line 50 and subarray 51 B generally below the line 50. A first group 52 of cells is laid out in a mirror image with a second group 53 of cells along a given bit line pair (e.g., 17, 18). As one proceeds up the bit line pair, the memory subarrays are flipped so as to share conductors 54A, 54B (buried diffusion) and metal-to-metal diffusion contacts 55, 56, 57, 58. The conductors 54A, 54B extend horizontally across the array to a vertical metal line 25 through metal-to-diffusion contacts 60A, 60B. The subarrays repeat on opposite sides of the metal bus 25 so that adjacent subarrays share a metal bus 25. The metal bus 25 is coupled to array ground and erase high voltage circuitry. Thus, the subarray layout requires two metal contact pitches per column of two transistor cells for the global bit lines and one metal contact pitch for the metal bus 25.

Floating gate memory cells include wells 73A–73L. Well lines 72A–72C are shown in FIG. 2A. Well lines 72A–72C are for applying bias voltages to wells 73A–73L. Well line 72A is coupled to wells 73A through 73D. Well line 72B is coupled to wells 73E through 73H. Well line 72C is coupled to wells 73I through 73I.

Figure 5:
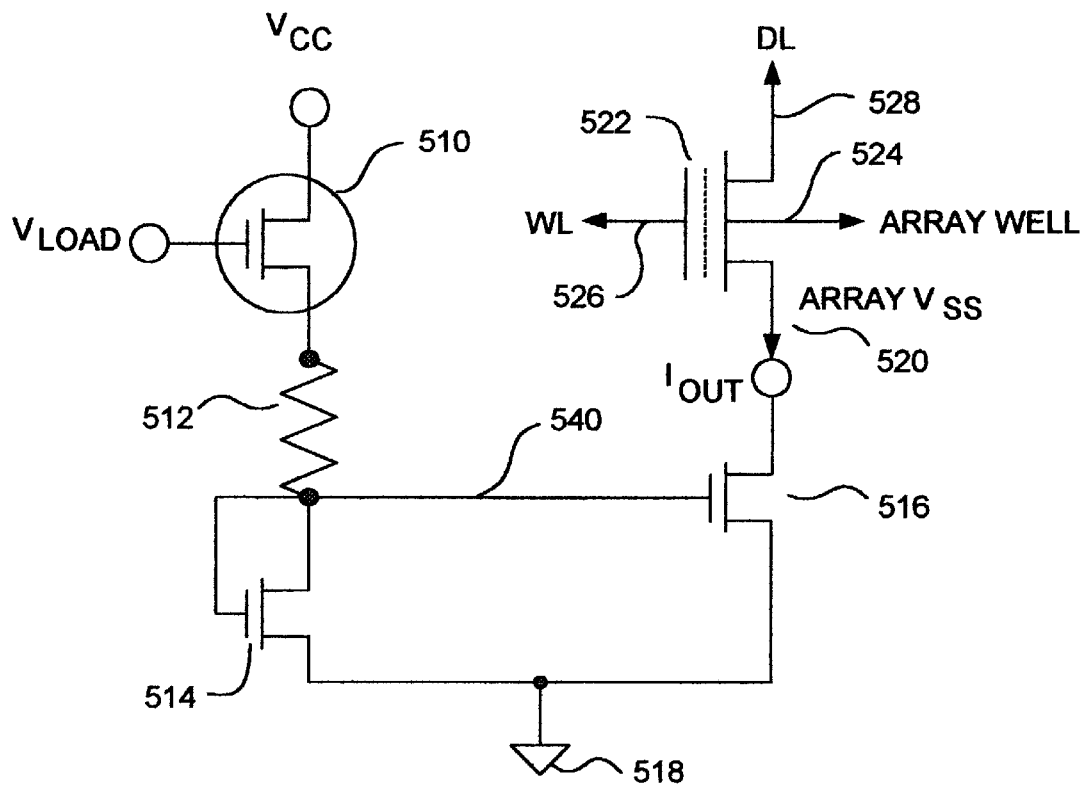
FIG. 5 is a diagram of a floating gate memory cell and a current limiter.

During a soft program pulse, a gate voltage is applied to gates of the floating gate cells via the word lines (WL$_{0-n}$), a drain voltage is applied via bit lines 17 and 18, a well bias is applied via well lines 72a–72c, and an active current limiter is applied to the sources via a structure including transistors 65A–D and the additional circuitry shown in FIG. 5, which forms a current mirror. In such an architecture, transistors 65A–D of FIG. 2A each correspond to a transistor such as transistor 516 shown in FIG. 5. BBSEL$_A$ and BBSEL$_B$ each correspond to the line 540 in FIG. 5, which is coupled to the gate of transistor 516. Not shown in FIG. 2A are additional well lines for the other floating gates shown in FIG. 2. However, additional well lines are used to apply well bias voltages to the other wells. Transistors 65A, 65B, 65C, and 65D are also selector decode transistors. These transistors on their source sides are connected to a generator to support 0 volts or a positive voltage depending on the mode of operation.

In this approach, using an active current limiter rather than grounding the source, the power of the pumping circuitry can be better utilized as to program the over-erased cells and decrease the leakage current from most of the cells by orders in magnitude. In an alternative system, the gate voltage can be stepped to decrease the current contribution from the over-erased cells.

The sector decode ability provided by the circuit of FIG. 2A, allows the circuitry to be implemented which applies a drain disturb style soft program pulse only to selected segments of the array by applying about 4 volts to the local drain lines, while coupling the source to an active current limiter.

Also an alternative system will apply the soft program pulse of about 4 volts, or more depending on circuit parameters, through the source terminal of devices being soft programmed, while coupling the bit lines or drain terminals to an active current limiter. The same segment-by-segment decoding, and word line drivers can be utilized in this source disturb approach.

Figure 2B:
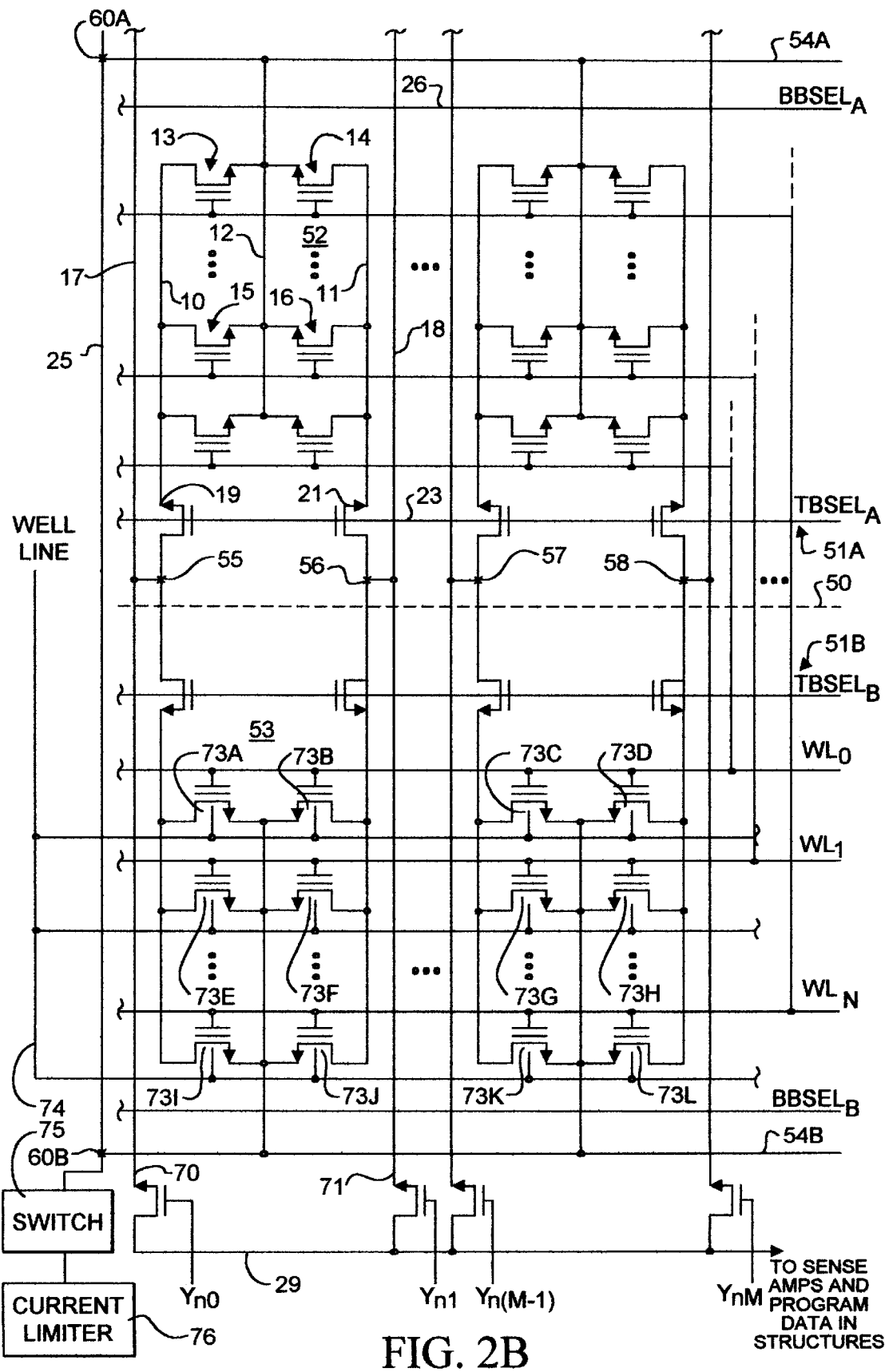
FIG. 2B is a circuit diagram showing a segmented array architecture for a floating gate memory device, with a common well line and current limiter.

FIG. 2B is similar to FIG. 2A. FIG. 2B includes common well line 74. Common well line 74 allows application of a well voltage to multiple cells. Instead of transistors 65A–D, FIG. 2B includes switch 75 and an active current limiter 76. Active current limiter 76 is coupled to metal bus 25 via switch 75. Active current limiter 76 provides a current sink commonly to multiple cells throughout the array.

Figure 3:
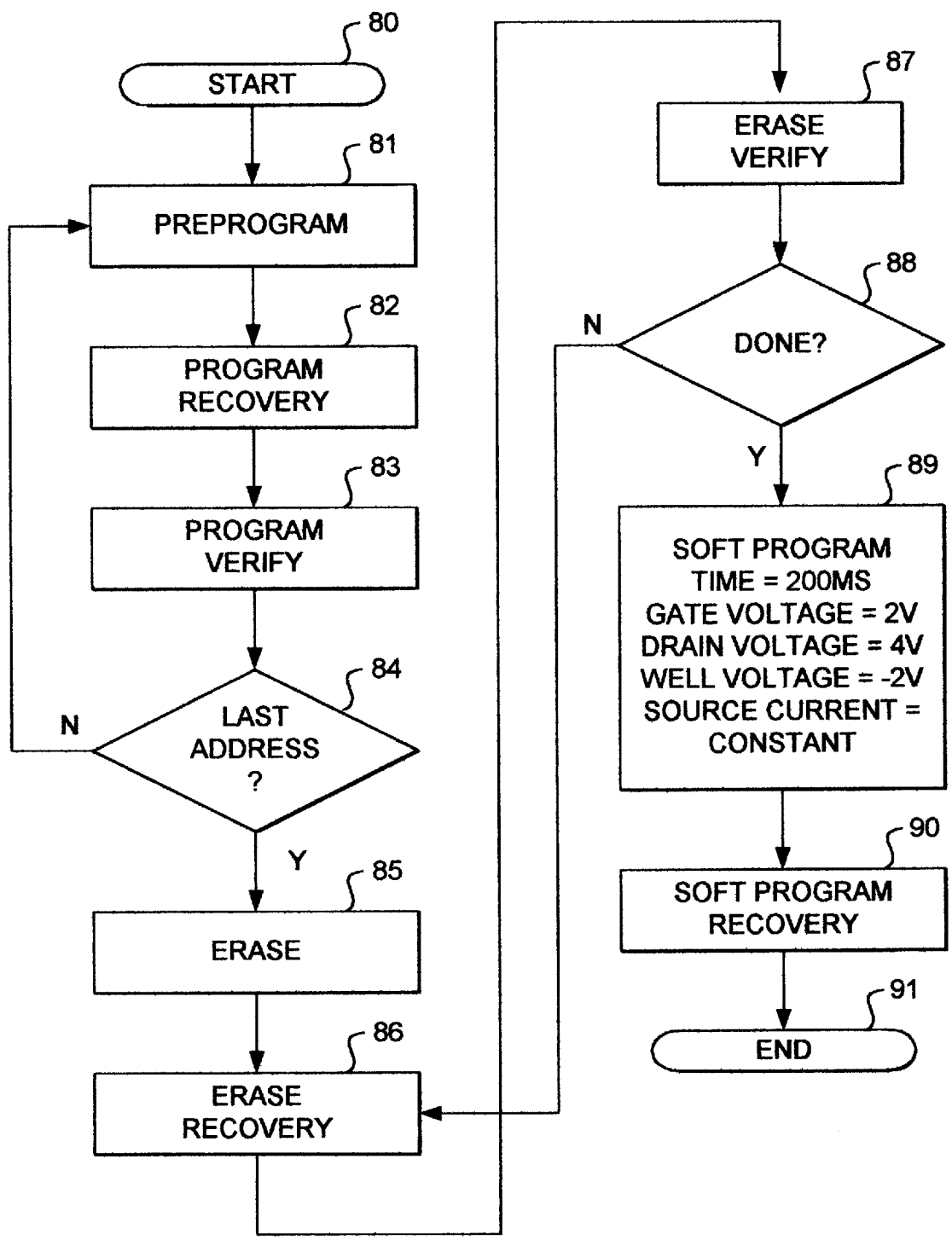
FIG. 3 is a flow chart showing soft programming.

Referring to FIG. 3, an overall flow chart of a chip or block erase process, including the soft program steps of an embodiment of the invention, is shown. After starting the erase operation (step 80), pre-programming is initiated for the chip or block selected for erase, through a host CPU or otherwise through command logic 5 (step 81). At step 82, a program recovery period occurs allowing the voltage to settle out or stabilize after pre-programming. At step 83, a program verify process occurs. The system then checks to see if the last address in the chip or block has been preprogrammed (step 84). If not, the process starting at the pre-programming step is repeated until all cells in the chip or block have been preprogrammed.

After pre-programming, the erase operation at step 85 is executed which is followed by the erase recovery period 86 to allow the erase voltage to settle out. Next, an erase verify operation 87 is performed. Then, the system checks to see if the erase process is complete at step 88. If not, it returns to step 85, performing the erase operation until complete. When complete, the soft program at step 89 is initiated in which the soft program pulse is applied to all cells in the entire chip or block subject of the erase operation in parallel. The soft program step 89 includes applying a gate voltage to the gates, a drain voltage to the drains, a well voltage to the wells, and a constant source current to the sources. The soft program recovery occurs at step 90. The process ends at step 91.

Figure 4:
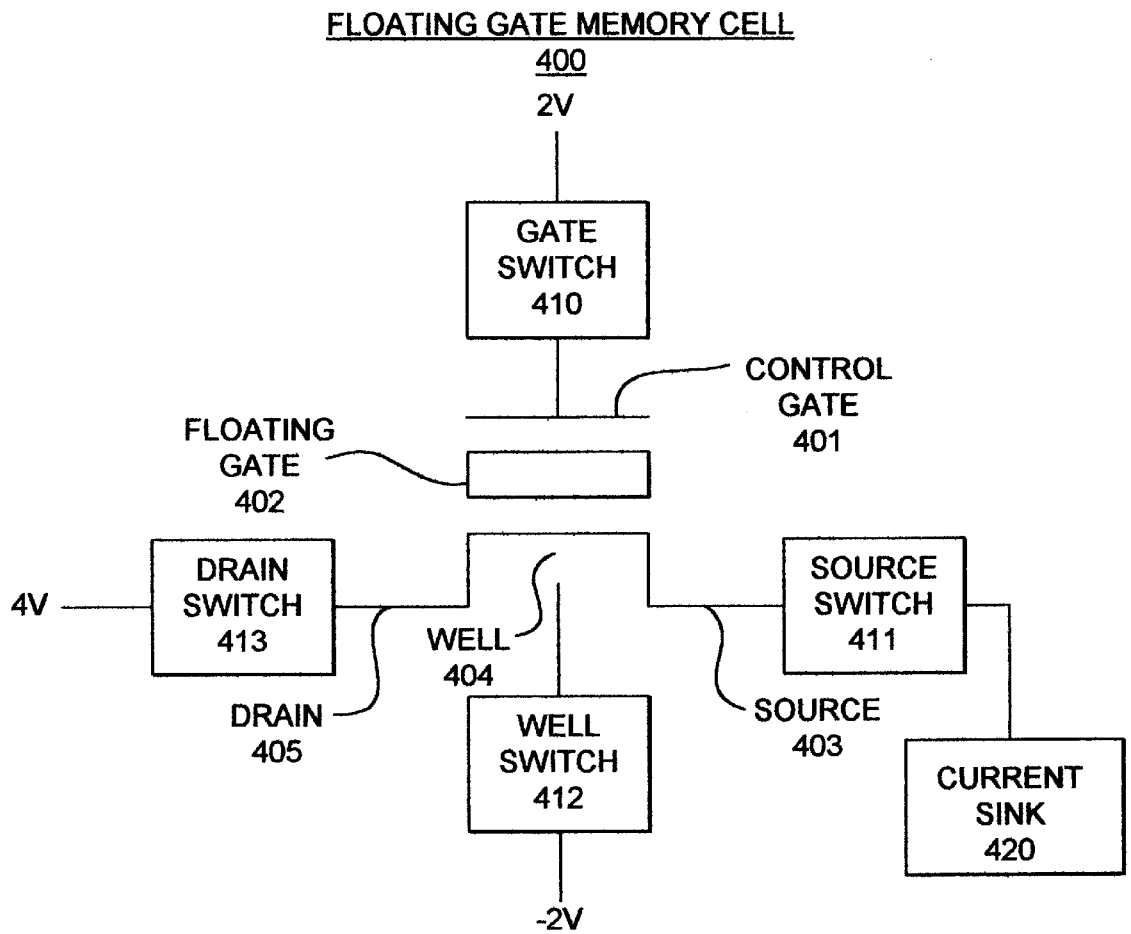
FIG. 4 is a circuit diagram of a floating gate memory cell with bias voltages and current sink.

FIG. 4 shows a floating gate memory cell configured for soft programming according to an embodiment of the invention. Floating gate memory cell 400 includes a control gate 401, a floating gate 402 under the control gate, a source 403, a well 404, and a drain 405. The cell 400 comprises a control gate and a floating gate from a stacked pair of polysilicon layers having a dielectric layer interposed between them. Gate switch 410 is coupled to control gate 401 and provides a control gate voltage of approximately 2 volts. Source switch 411 is coupled to source 403 and provides an active current limiter 420 to source 403. Well switch 412 is coupled to well 404 and provides a well bias voltage of approximately −2 volts to well 404. Drain switch 413 is coupled to drain 405 and provides a drain voltage of approximately 4 volts to drain 405.

The configuration shown in FIG. 4 allows for soft programming of floating gate memory cell 400. The soft programming causes hot electron injection of electrons onto the floating gate. In one embodiment of the invention the length ($L_{mask}$) of a cell is 0.6 micrometers, and the width ($W_{mask}$) is 0.4 micrometers. The tunnel oxide is 100 Angstroms, and the oxide nitride oxide (ONO) layer is approximately 140 Angtroms. The floating gate cell is an n-channel transistor.

A triple well architecture is used for a cell. The triple well structure includes a deep N-well, a P-well, and an N-well. If the P-well is kept grounded, a twin well structure can be used. The P-well acts as a channel well and the deep N-well acts as the isolation well. During soft programming, the channel well can be biased to an non-positive voltage, while the isolation well is kept equal to or larger than VCC.

An advantage of use of an active current limiter is that usable electrons flowing from the source are conducted to lower $V_T$ bits where the cell conductance is much higher. Therefore, the soft program efficiency will be greater. The conductance modulation is through the charged source voltage and may be proportional to $\log_{10}\{-[V_S+\alpha_G \Delta V_T(V_{SB})]/110 \text{ mV}\}$, where $\alpha_G$ is the gate coupling ratio. The active current limiter 420 applies a negative constant current to the source. The configuration shown has the additional benefit that the drain current could be supplied directly from $V_{CC}=5$ volts, which may be larger than the current available from charge pumping circuitry. If $V_{CC}$ is lowered, the relative voltage can be changed accordingly. The use of a negative well bias will require another pumping circuit. If a positive pump circuit is used for the drain voltage, then the negative pump circuitry will not be needed. The difference between the drain voltage and the well bias voltage is important.

A fast $V_T$ convergence is desirable. The longer the soft program time, the tighter the $V_T$ convergence. The upper limit is the total sector electrical erase time. Initially bits (cells) will have a wider $V_T$ distribution, and the initial source voltage will be high. Optionally, a stepped or ramped word line voltage (gate voltage) may be used to change the drain to source voltage margin. The voltage between gate and source will affect the saturated value of converged $V_T$.

Since the soft program current is also suppressed through the $\Delta V_T(V_{SB})$ from body effect, the higher impurity concentration of a substrate is helpful. The high impurity concentration of the substrate will suppress the short channel effect and its related leakage. The drain coupling ratio, which may affect the leakage, may also be reduced. The drain coupling is a capacitance coupling effect from the N+ floating gate overlap.

More details regarding methods of soft programming floating gates are described in U.S. patent application entitled METHOD AND SYSTEM FOR SOFT PROGRAMMING ALGORITHM, application Ser No. 08/619,485, filed on Mar. 21, 1996, inventors: Yiu, et al., which is incorporated herein by reference.

FIG. 5 is a diagram of a memory cell and an active current limiter according to an embodiment of the present invention. The current limiter circuit corresponds to active current limiter 420 of FIG. 4. The current limiter switch includes transistor 510 coupled to $V_{CC}$ and $V_{load}$, resistor 512, transistor 514, and transistor 516. $I_{out}$ is coupled to source switch 411. $V_{load}$ is used to control the current from $I_{out}$. $I_{out}$ is coupled to array $V_{SS}$ 520, which is coupled to sources of memory cells including memory cell 522. Also shown in FIG. 5 are wordline 526, array well 524, and drain line 528. With the configuration shown in FIG. 5, current is limited from the sources of memory cells in an array of memory cells.

A block of memory cells may be programmed simultaneously. To program a block of 512 K cells is simultaneously, the current limiter is constructed to cause the total current through the current limiter to be approximately 2 mA for the block. In an alternative embodiment, the current for the 512 K cell block may be less than 10 mA.

Figure 6:
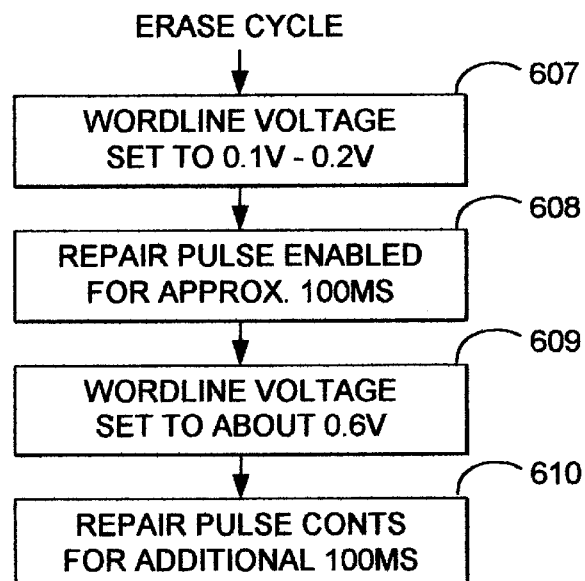
FIG. 6 is a flow chart illustrating a two stage soft programming process.

Turning to FIG. 6, another embodiment of this invention is shown. Optionally, as shown here, the repair pulse may be applied in two sequential steps. In the first step, the word line voltage is maintained at a first level about ground, and in the second step, the word line voltage is maintained at a second level about ground. FIG. 6 shows that during steps 607 through 610, the word line voltage is maintained at two different levels while the repair pulse is applied to the bit line.

First, step 607 provides that the word line voltage is maintained above ground, e.g. between 0.1 volts and 0.2 volts, for a period of time, e.g. approximately 100 milliseconds. The first stage of the repair pulse is maintained during step 608. By first applying a lower word line bias during the first soft program steps 607 and 608, the current of the "over-erased" cells is less than would occur with higher word line voltage, yet the majority over-erased cells are pushed toward being "normal cells" (i.e. they recover the threshold voltage to a better value). Thus, after the first soft program steps 607 and 608, some over-erased cells have been recovered and the second step can be applied. The second steps 609 and 610 include setting the word line voltage to about 0.6 V, which is applied for an additional period of time, e.g. approximately 100 milliseconds while the repair pulse is applied.

Accordingly, during the repair pulse, the word line voltage is driven in two stages, the first stage occurring during the 100 ms period while the word line voltage is maintained between approximately 0.1 volts and 0.2 volts, the second stage occurring during the 100 ms period while the word line voltage is maintained about 0.6 V. This two step process enhances the soft programming of the over-erased cells with less operating current and better operating efficiency.

The following table shows alternative values for a two-step soft programming process:

| 3V Technology | | | | | |
|---|---|---|---|---|---|
| | Drain | Gate | Source $I_s$ for a 512K cell block | Substrate | Time |
| 1st step | +5.5 V | +2.5 V | 1.5 mA | GND | 50 ms |
| 2nd step | +5.5 V | +3.1 V | 1.5 mA | GND | 100 ms |

| 5V Technology | | | | | |
|---|---|---|---|---|---|
| | Drain | Gate | Source $I_s$ for a 512K cell block | Substrate | Time |
| 1st step | $V_{CC}$ | 0 V | 1.2 mA | GND | 50 ms |
| 2nd step | $V_{CC}$ | 0.6 V | 1.2 mA | GND | 50 ms |

The following shows voltage and current ranges for soft programming:

| Drain | Gate | Source | Substrate |
|---|---|---|---|
| <Drain Junction Breakdow Voltage $V_{DB}$ < 8 V | $V_{GS}$ > −1 V $V_{DG}$ > 2 V | $I_S$/512K cells <10 mA $V_{SB}$ > −0.5 V | ≦0 V |

Accordingly, the method and circuit for substrate current induced hot e⁻ injection for $V_T$ convergence at low $V_{CC}$ voltage have been provided. The method and circuit provide quicker and more efficient repairing of over-erased cells in a flash memory.

Figure 7:
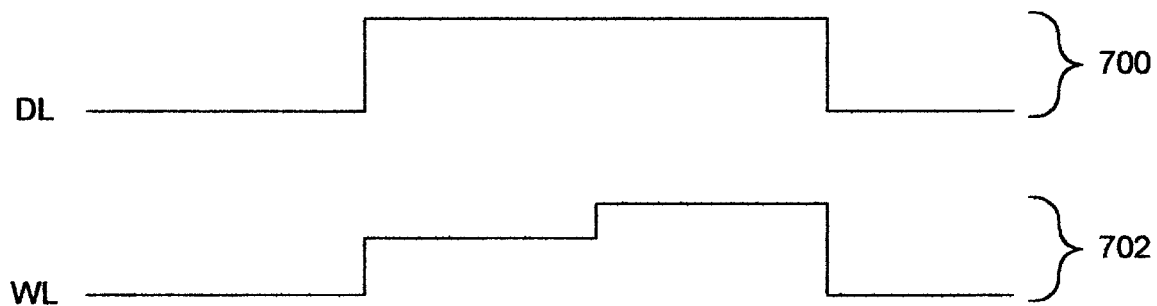
FIG. 7 is a timing diagram of a programming sequence.

FIG. 7 is a timing diagram of one embodiment of a programming sequence. Voltage is applied to drain as shown by trace 700. A changing voltage is applied to the word line during programming as shown by trace 702. The drain and gate voltage may be applied simultaneously at each step, or the gate voltage may be applied first.

The foregoing description of embodiments of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A method for correcting an over-erase condition within a non-volatile memory array, comprising:

providing a non-volatile memory array having a plurality of single transistor memory cells, each memory cell comprising a stacked pair of control and floating gates spaced above a channel region interposed between a source and drain region; and applying a first voltage to the control gate, an active current limiter to the source region, a non-positive voltage to the channel region, and a positive voltage to the drain region.

2. The method as recited in claim 1, wherein said providing step comprises patterning the stacked pair of control and floating gates from a stacked pair of polysilicon layers having a dielectric layer interposed therebetween.

3. The method as recited in claim 1, wherein said channel region comprises a portion of a single crystalline substrate material, wherein said portion is adapted to receive a non-positive voltage.

4. The method as recited in claim 1, wherein said non-positive voltage is a voltage having an absolute magnitude greater than 0.5.

5. The method as recited in claim 1, wherein said non-positive voltage is a voltage having an absolute magnitude greater than 1.

6. The method as recited in claim 1, wherein said positive voltage is a voltage having an absolute magnitude less than 5.

7. The method as recited in claim 1, wherein said positive voltage is a voltage having an absolute magnitude less than 4.5.

8. The method as recited in claim 1, wherein said first voltage is between −1 V and 6 V.

9. The method as recited in claim 1, wherein the active current limiter is a current mirror.

10. The method as recited in claim 1, wherein the active current limiter is an NMOSFET operating at saturation mode.

11. The method as recited in claim 1, wherein the active current limiter is a current source.

12. The method as recited in claim 1, wherein the active current limiter provides current in a range of 1.5 mA to 1.2 mA per 512 K memory cells.

13. The method as recited in claim 1, as a result of said applying step, inducing electrons onto said floating gate for neutralizing positive charge thereon.

* * * * *